United States Patent
Rush et al.

(10) Patent No.: US 6,655,423 B2
(45) Date of Patent: Dec. 2, 2003

(54) UNIFIED POD QUICK-OPENING APPARATUS

(75) Inventors: John Rush, Mountain View, CA (US); Chawshiang Wu, Iisin-Chu (TW); Torben J. Ulander, Sunnyvale, CA (US); Kung Chris Wu, Sunnyvale, CA (US)

(73) Assignee: Fortrend Taiwan Scientific Corp. (TW)

( * ) Notice: Subject to any disclaimer, the term of this patent is extended or adjusted under 35 U.S.C. 154(b) by 0 days.

(21) Appl. No.: 10/234,474

(22) Filed: Sep. 5, 2002

(65) Prior Publication Data

US 2003/0047233 A1 Mar. 13, 2003

(30) Foreign Application Priority Data

Sep. 13, 2001 (TW) ...................................... 90215827 U

(51) Int. Cl.[7] ................................................ B65B 1/04
(52) U.S. Cl. ......................................... 141/98; 414/937
(58) Field of Search ........................... 141/98; 414/217, 414/217.1, 805, 939, 937

(56) References Cited

U.S. PATENT DOCUMENTS 6,013,920 A * 1/2000 Gordon et al. ......... 250/559.36
6,419,438 B1 * 7/2002 Rosenquist ................. 414/217

* cited by examiner

Primary Examiner—Steven O. Douglas
(74) Attorney, Agent, or Firm—Bacon & Thomas, PLLC

(57) ABSTRACT

A front-opening unified pod quick-opening apparatus. The apparatus is positioned in a front-opening unified pod loading system. The apparatus has a rail, a slide, a short linking rod having a first end rotatably fixed on the slide to drive the slide to move along the rail, a long rocker arm having a first end rotatably fixed on a second end of the short linking rod, and a second end rotatably fixed on a pin on the backboard; and a power source. When the power source drives the long rocker arm to rotate upwards around the pin on the backboard, the long rocker arm leads the short linking rod, and the short linking rod drives the slide to move upwards along the rail which results in an upward rectilinear motion, and vice versa.

5 Claims, 6 Drawing Sheets

UNIFIED POD QUICK-OPENING APPARATUS

BACKGROUND OF THE INVENTION

1. Field of the Invention

The present invention relates to a FOUP (front-opening unified pod) quick-opening apparatus and, more particularly, to such FOUP opening apparatus, which is suitable for use in the loading-in interface in a wafer manufacturing process to automatically close/open the cover of a FOUP.

2. Description of Related Art

In the fabrication of wafers, wafers are put in a unified pod, and the purity of the small inside space of the unified pod is well controlled. Because the purity of the small inside space of the unified pod is well controlled, the purity of the cleaning room is less critical. This measure saves much wafer manufacturing equipment cleaning cost. However, external dust or human body dust may be carried in the manufacturing equipment when opening the cover of the unified pod, causing a contamination to wafers. Conventional FOUP opening apparatus generally has a electric motor driving a leading screw to move a gate and the cover of the FOUP in horizontal direction and in vertical direction. Nevertheless, the conventional FOUP opening apparatus needs high speed of motor to achieve a request for quickly moving the cover.

In addition, the conventional FOUP opening apparatus occupies too much space in the whole FOUP loading system to suit with the light-type FOUP loading system.

SUMMARY OF THE INVENTION

The invention has been accomplished to provide a FOUP quick-opening apparatus, which eliminates the aforesaid problem. It is the main object of the present invention to provide a FOUP quick-opening apparatus, which can be set into a light-type FOUP loading system, and utilize a power source to enable the FOUP quick-opening apparatus to accomplish open/close movement quickly.

The other object of the present invention is to provide a FOUP quick-opening apparatus' which can reduce the stoke and the space of the gate efficiently, and increase the moving speed of the ends.

To achieve the aforesaid objects and according to one aspect of the present invention, the present invention provides a front-opening unified pod quick-opening apparatus positioned in a front-opening unified pod loading system, when a front-opening unified pod being located on the loading system, a cover of the front-opening unified pod being secured on a gate of a backboard of the loading system such that the front-opening unified pod quick-opening apparatus moving the gate with the cover upward and downward, the front-opening unified pod quick-opening apparatus comprising:

- a rail positioned vertically on the backboard;
- a slide slidably mounted on the rail, providing a movement along the rail;
- a short linking rod having a first end rotatably fixed on the slide to drive the slide to move along the rail;
- a long rocker arm having a first end rotatably fixed on a second end of the short linking rod, and a second end rotatably fixed on a pin on the backboard; and
- a power source adapted to drive the long rocker arm to rotate around the pin on the backboard;

wherein when the power source drives the long rocker arm to rotate upward round the pin on the backboard, the long rocker arm leads the short linking rod, and the short linking rod drives the slide to move upward along the rail then results in an upward rectilinear motion; and when the power source drives the long rocker arm to rotate downward round the pin on the backboard, the slide is driven to move downward along the rail then results in a downward rectilinear motion.

Other objects, advantages, and novel features of the invention will become more apparent from the following detailed description when taken in conjunction with the accompanying drawings.

BRIEF DESCRIPTION OF THE DRAWINGS

There are presently shown in the drawings embodiments of which are presently preferred, it being understood, however, that the invention is not so limited to the precise arrangements and instrumentalities shown.

DETAILED DESCRIPTION OF THE PREFERRED EMBODIMENT

Figure 1:
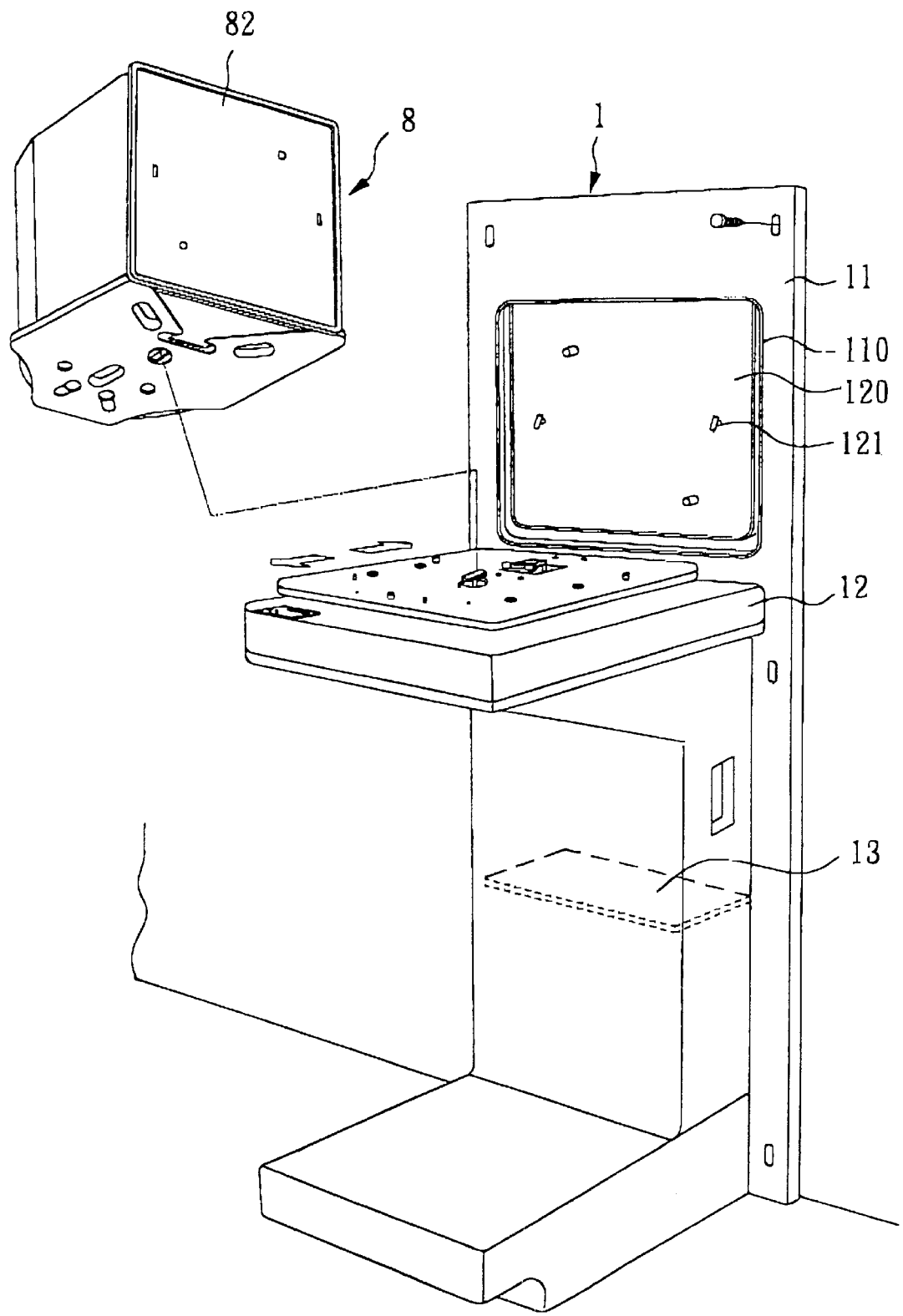
FIG. 1 is a perspective view of a FOUP and FOUP quick-opening apparatus.

Please refer to FIG. 1. FIG. 1 is a perspective view of a FOUP 8 and a FOUP auto-loading structure 1. A FOUP (front-opening unified pod) 8 is shown comprising a cover 82 that closes the opening. The FOUP auto-loading structure 1 is adapted to load and open/close the cover 82 of the FOUP 8. The FOUP auto-loading structure 1 comprises a backboard 11 fixedly fastened to a corresponding assembling side. The backboard 11 has a table 12 transversely disposed on the middle, a base 13 fixedly provided at the bottom side thereof. An access 110 disposed on the upper side of the backboard 11 above the table 12, and a gate 120 fitting the access 110 of the backboard 11.

Figure 2:
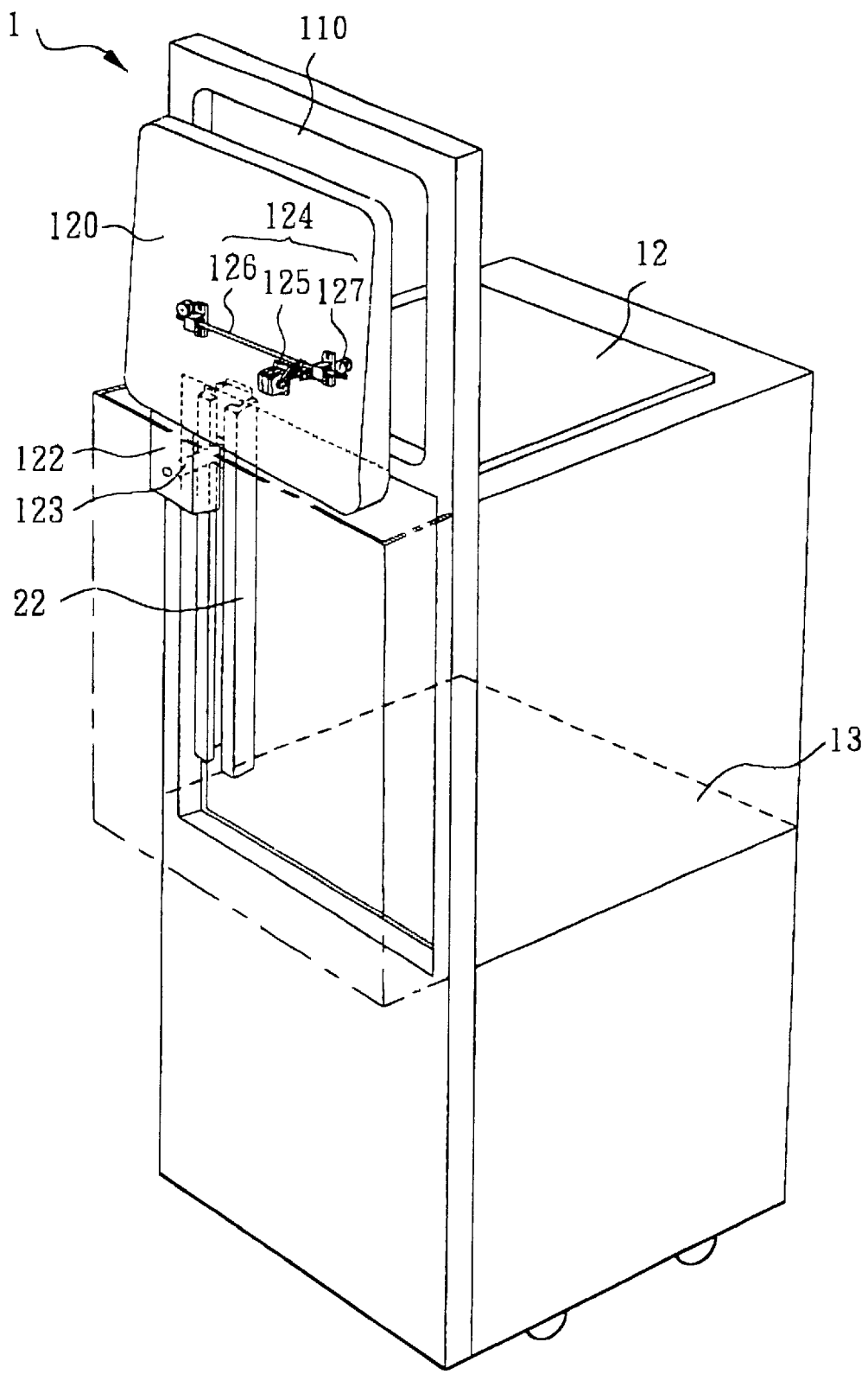
FIG. 2 is a back-view of the FOUP quick-opening apparatus in FIG. 1.

Next, please refer to FIG. 2. FIG. 2 is a back-view of the FOUP quick-opening apparatus in FIG. 1. Two racks 122 fixedly fastened to the back sidewall of the gate 120 and arranged in parallel; a support arms 123 forwardly extended from the racks 122 below the gate 120 and inserted through the backboard 11 and fixedly connected to a slide of the FOUP quick-opening apparatus according to the present invention; and a driving unit 124 mounted on the back sidewall of the gate 120 and controlled to close/open the cover 82 of the FOUP 8. The driving unit 124 comprises a transmission shaft 126, a motor 125 controlled to rotate the transmission shaft 126, two rotary bolts 127 respectively coupled to the transmission shaft 126 and inserted through the through holes 121 of the gate 120 to open the cover 82 from the opening of the FOUP 8

Figure 3:
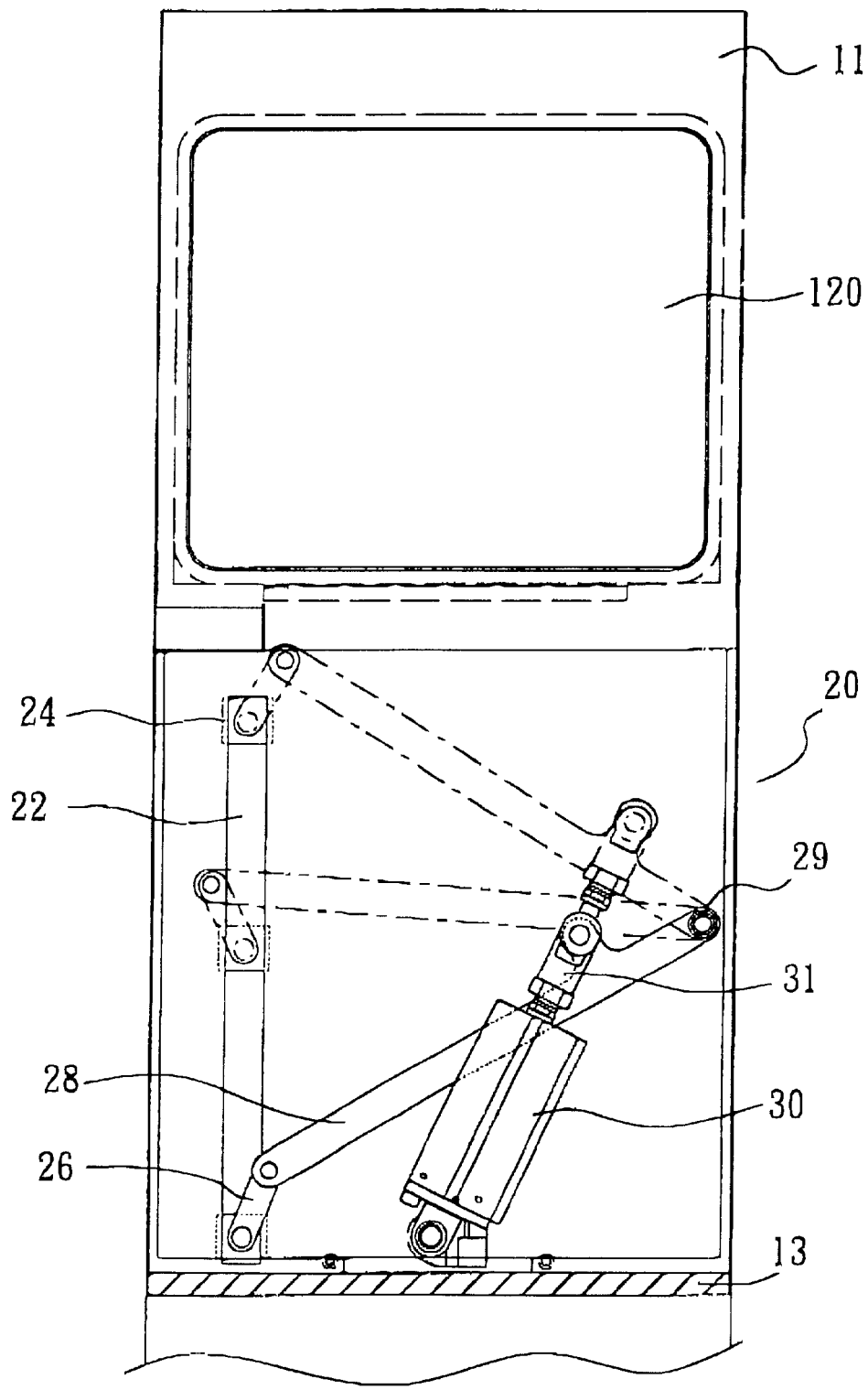
FIG. 3 is a front-view of an embodiment of the present invention.
Figure 4:
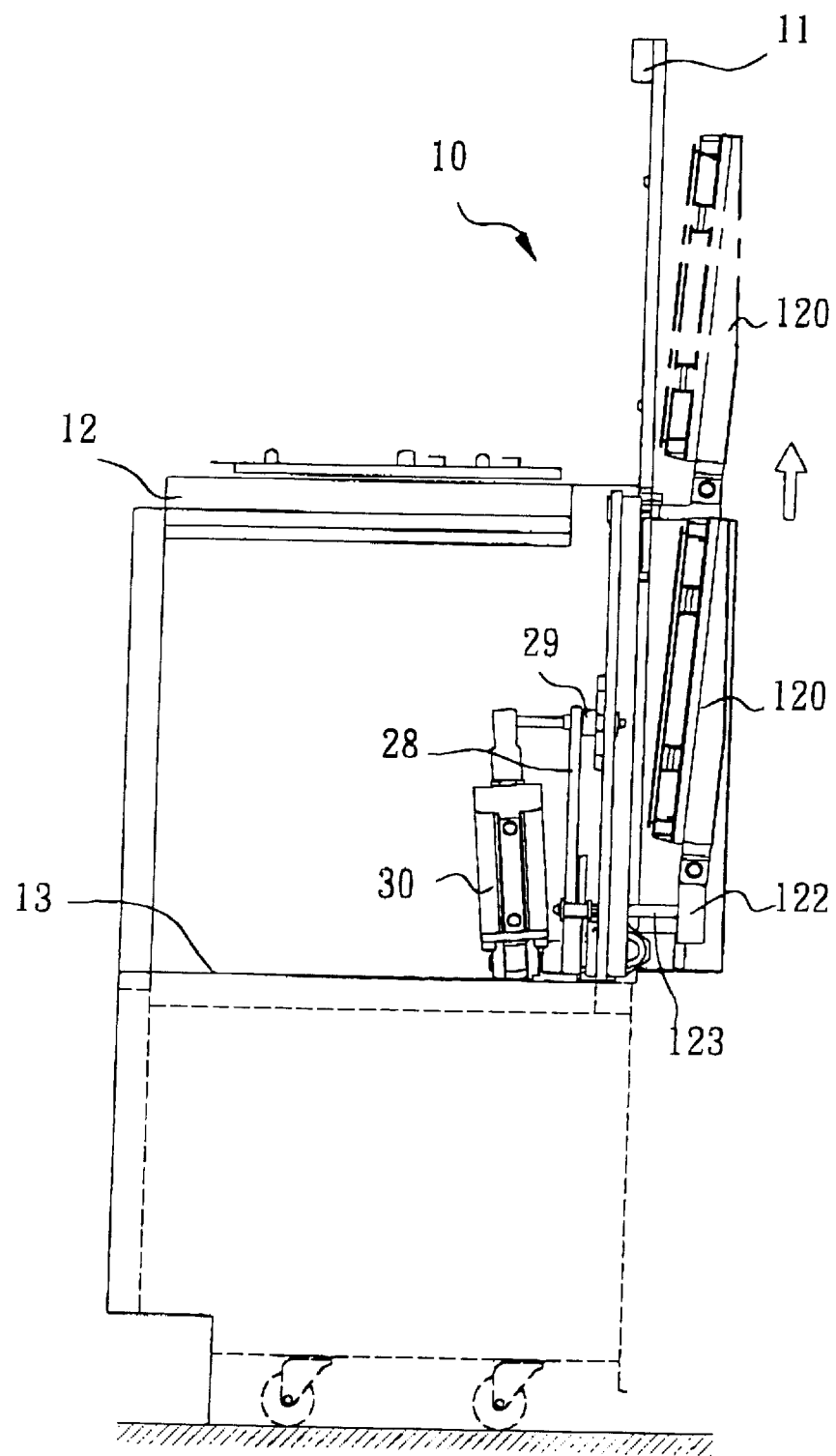
FIG. 4 is a side-view of an embodiment of the present invention.
Figure 5:
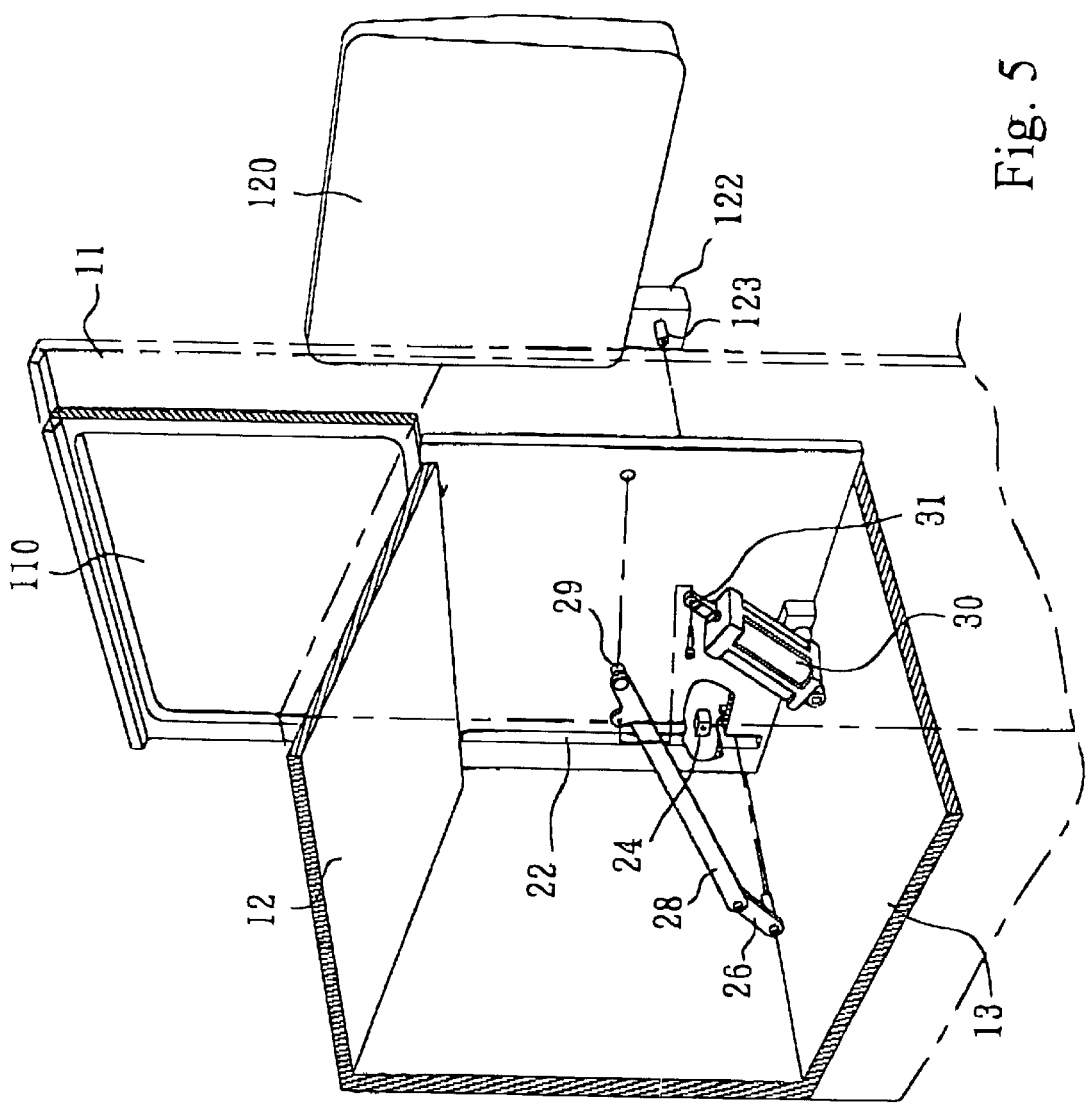
FIG. 5 is a perspective view of the embodiment of the present invention.

Please refer to FIG. 3 to FIG. 5. FIG. 3 is a front-view of an embodiment of the present invention. FIG. 4 is a side-view of an embodiment of the present invention. FIG. 5 is a perspective view of the embodiment of the present invention. In the embodiment of the present invention, a FOUP quick-opening apparatus 20 is mounted in the loading system 1. The FOUP quick-opening apparatus 20 has a rail 22 positioned on the backboard 11; a slide 24 slidably mounted on the rail 22; and a short linking rod 26 has a first end rotatably fixed on the slide 24 to drive the slide 24 to move along the rail 22 and a second end connected to a first end of a long rocker arm 28. The long rocker arm 28 has a second end rotatably fixed on a pin 29 on the backboard 11. The FOUP quick-opening apparatus 20 further has an extension gas cylinder 30 having an end connected on a predetermined position of the long rocker arm 28 and another end rotatably fixed on the base 13 of the loading system 1. The gas cylinder 30 is electrically connected to a controller (not shown) to control driving direction of the gas cylinder 30.

When the controller sends a control signal to cause a shaft 31 of the gas cylinder 30 to drive the long rocker arm 28 to rotate upward, so the long rocker arm 28 leads the short linking rod 26, which results in the short linking rod 26 drives the slide 24 to move along the rail 22 to generate an upward rectilinear motion. In contrary, when the controller sends a control signal to cause a shaft of the gas cylinder 30 to drive the long rocker arm 28 to rotate downward, so the long rocker arm 28 leads the short linking rod 26 again, which results in the short linking rod 26 drives the slide 24 to move along the rail 22 to generate a downward rectilinear motion.

The end of the gas cylinder 30 connected to the long rocker arm 28 is in a distance of ¼ long rocker arm 28's total length from the first end of the long rocker arm 28. Therefore, when the shaft 31 of the gas cylinder 30 extends one length unit, the second end of the long rocker arm 28 will move four length units. Via the connected short linking rod 26 and the slide 24 connected thereon, this end movement characteristic of the long rocker arm 28 can be transfer into a rectilinear motion along the rail 22.

Figure 6:
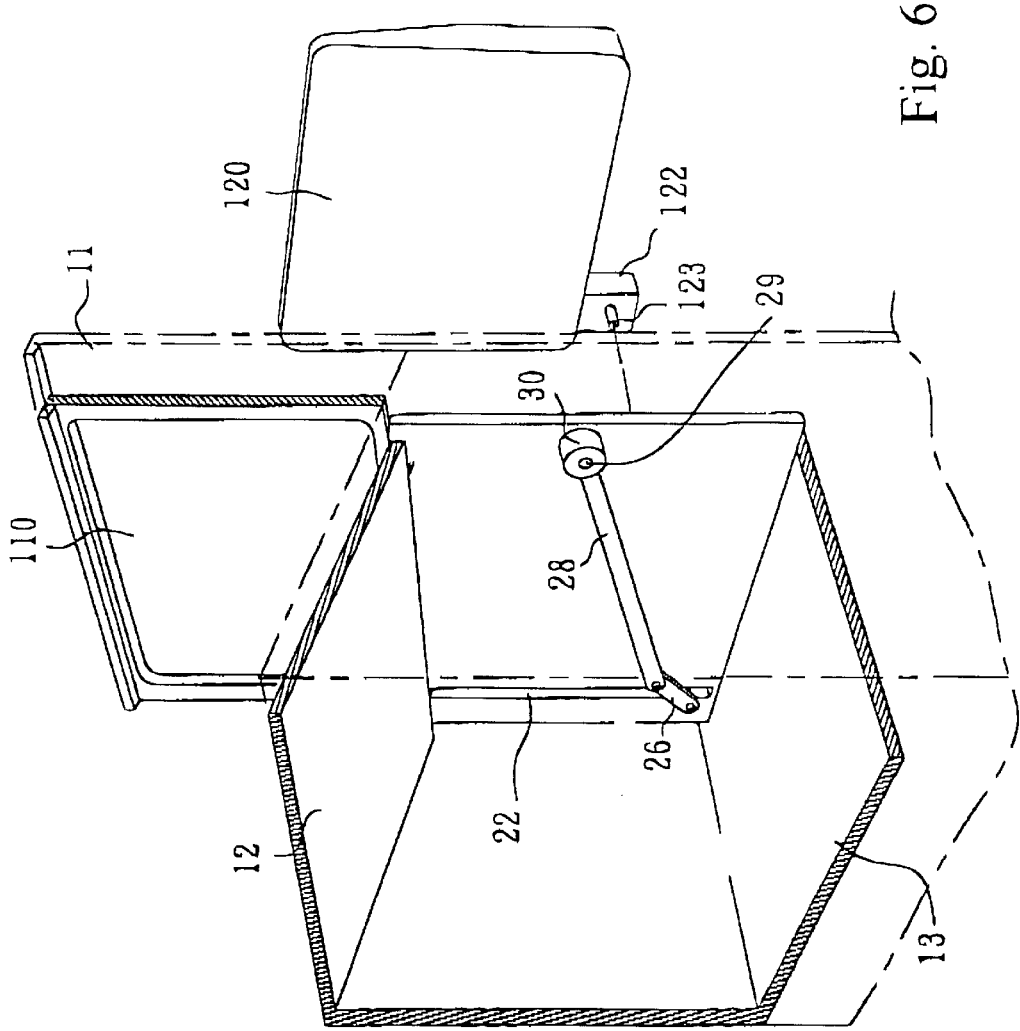
FIG. 6 is a perspective view of another embodiment of the present invention.

Please refer to FIG. 6. FIG. 6 is a perspective view of another embodiment of the present invention. In another embodiment of the present invention, the gas cylinder 30 is a gas gyro-cylinder, which is connected on the pin on the backboard to provide a rotating power to the long rocker arm. Therefore, the first end of the long rocker arm 28 connected to the pin 29 can be driven directly to lead the short linking rod 26 and the slide 24 connected thereon, to achieve the same stroke magnification effect. In addition, besides the above-mentioned expansion gas cylinder and the gas gyro-cylinder, the FOUP quick-opening apparatus can be used with any other suitable power source such as an oil cylinder or electric motor etc.

Furthermore, since the long rocker arm 28 takes the pin 29 as a center of a circle to generate an arc motion, the component of the arc motion on the rail 22 will form a simple harmonic motion which causes the second end of the long rocker arm 28 has slower speed at the upper end and the lower end of the rail 22 and faster speed at the middle section of the rail 22.

In the present invention, the combination of the rocker arm, the linking rod, and the slide and the rail can magnify the driven distance of the power source, speed up the moving speed of the gate of the loading system, and slow down the moving speed at the upper end and the lower end. Furthermore, the push point on the long rocker arm acted by the power source can be located at different position according to practical requirement, and correspondingly, the magnified driven distance will be different. In addition, an appropriate position for the fixed point of the power source can be adjusted according to the space condition easily.

As stated above, when the FOUP 8 is carried by labor or an automatic truck to put on the table 12. The FOUP 8 forwards, causing the opening 81 of the FOUP 8 to be forced into close contact with the access 110 and attaches to the gate 120. Therefore, when the motor 125 of the driving unit 124 is started to rotate the rotary bolts 127 in opening the cover 82, the FOUP 8 is maintained free from contamination. Thereafter, the FOUP quick-opening apparatus 20 is operated to lower the cover 82, for allowing the internal mechanical arm of the manufacturing equipment to pick up the wafers from the FOUP 8. On the contrary, when closing the cover 82 on the FOUP 8, the aforesaid procedure is repeated reversely. Therefore, the FOUP 8 can be automatically opened and closed in the manufacturing equipment without causing contamination.

The invention has been described using exemplary preferred embodiments. However, or those skilled in this field the preferred embodiments can be easily adapted and modified to suit additional applications without departing from the spirit and scope of this invention. Thus, it is to be understood that the scope of the invention is not limited to the disclosed embodiments. On the contrary, it is intended to cover various modifications and similar arrangements based upon the same operating principle. The scope of the claims, therefore, should be accorded the broadest interpretations so as to encompass all such modifications and similar arrangements.

Although the present invention has been explained in relation to its preferred embodiment, it is to be understood that many other possible modifications and variations can be made without departing from the spirit and scope of the invention as hereinafter claimed.

What is claimed is:

1. A front-opening unified pod quick-opening apparatus positioned in a front-opening unified pod loading system, when a front-opening unified pod being located on the loading system, a cover of the front-opening unified pod being secured on a gate of a backboard of the loading system such that the front-opening unified pod quick-opening apparatus moving the gate with the cover upward and downward, the front-opening unified pod quick-opening apparatus comprising:

a rail positioned vertically on the backboard;

a slide slidably mounted on the rail, providing a movement along the rail;

a short linking rod having a first end rotatably fixed on the slide to drive the slide to move along the rail;

a long rocker arm having a first end rotatably fixed on a second end of the short linking rod, and a second end rotatably fixed on a pin on the backboard; and a power source adapted to drive the long rocker arm to rotate around the pin on the backboard;

wherein when the power source drives the long rocker arm to rotate upward round the pin on the backboard, the long rocker arm leads the short linking rod, and the short linking rod drives the slide to move upward along the rail then results in an upward rectilinear motion; and when the power source drives the long rocker arm to rotate downward round the pin on the backboard, the slide is driven to move downward along the rail then results in a downward rectilinear motion.

2. The front-opening unified pod quick-opening apparatus of claim 1, wherein further comprises a controller electrically connected to the power source, adapted to control driving direction of the power source.

3. The front-opening unified pod quick-opening apparatus of claim 1, wherein the loading system further comprises:

a machine base, said machine base comprising the backboard, a table on the middle of the backward, and a base at a bottom side of the backboard, the backboard having an access and a gate on an upper side of the backboard.

4. The front-opening unified pod quick-opening apparatus of claim 1, wherein the power source is a gas cylinder which has an end connected on a predetermined position of the long rocker arm and another end rotatably fixed on a predetermined of the loading system.

5. The front-opening unified pod quick-opening apparatus of claim 1, wherein the power source is a gas gyro-cylinder connected on the pin on the backboard to provide a rotating power to the long rocker arm.

\* \* \* \* \*